United States Patent [19]

Matsui et al.

[11] Patent Number: 4,931,994

[45] Date of Patent: Jun. 5, 1990

[54] STATIC SEMICONDUCTOR MEMORY WITH SECTION AND BLOCK SENSE AMPLIFIERS

[75] Inventors: Masataka Matsui, Tokyo; Jun-ichi Tsujimoto, Yokohama; Takayuki Ootani, Tokyo; Mitsuo Isobe, Yokohama, all of Japan

[73] Assignee: Kabushiki Kaisha Toshiba, Kawasaki, Japan

[21] Appl. No.: 156,537

[22] Filed: Feb. 16, 1988

[30] Foreign Application Priority Data

Feb. 16, 1987 [JP] Japan .................. 62-32716

[51] Int. Cl.$^5$ .............................................. G11C 7/80
[52] U.S. Cl. ............................ 365/189.01; 365/205; 365/207; 365/190; 306/530
[58] Field of Search ............... 365/182, 205, 207, 231, 365/230, 189, 190, 189.01, 230.01; 307/530

[56] References Cited

U.S. PATENT DOCUMENTS

| | | | |
|---|---|---|---|
| 4,556,961 | 12/1985 | Iwahashi et al. | 365/205 |
| 4,683,555 | 7/1987 | Pinkham | 365/189 |
| 4,691,298 | 9/1987 | Fukuda et al. | 365/189 |
| 4,715,017 | 12/1987 | Iwahashi | 365/189 |

Primary Examiner—Terrell W. Fears
Attorney, Agent, or Firm—Finnegan, Henderson, Farabow, Garrett and Dunner

[57] ABSTRACT

A static semiconductor memory comprises a word line, a memory cell array divided into a plurality of blocks in an extending direction of the word line, each block including a plurality of sections each of which includes a plurality of static memory cells, a controller, a section data line provided for each section, first sense amplifiers, a block data line provided for each block, second sense amplifiers, a main data line and a latch circuit for latching data on the main data line. The controller selects an arbitrary section in the memory cell array at the time of data readout and controls the reading of data from memory cells included in the selected section. The section data line is supplied with data read out from the memory cells. The first sense amplifiers, coupled at their input terminals to the section data line, are activated only when their associated section is selected. The individual first sense amplifiers in the same block have their output terminals commonly coupled to the block data line. Each second sense amplifier, coupled at its input terminal to the associated block data line, is activated only when the sections belonging to that block are selected. The second sense amplifiers have their output terminals commonly coupled to the main data line.

14 Claims, 6 Drawing Sheets

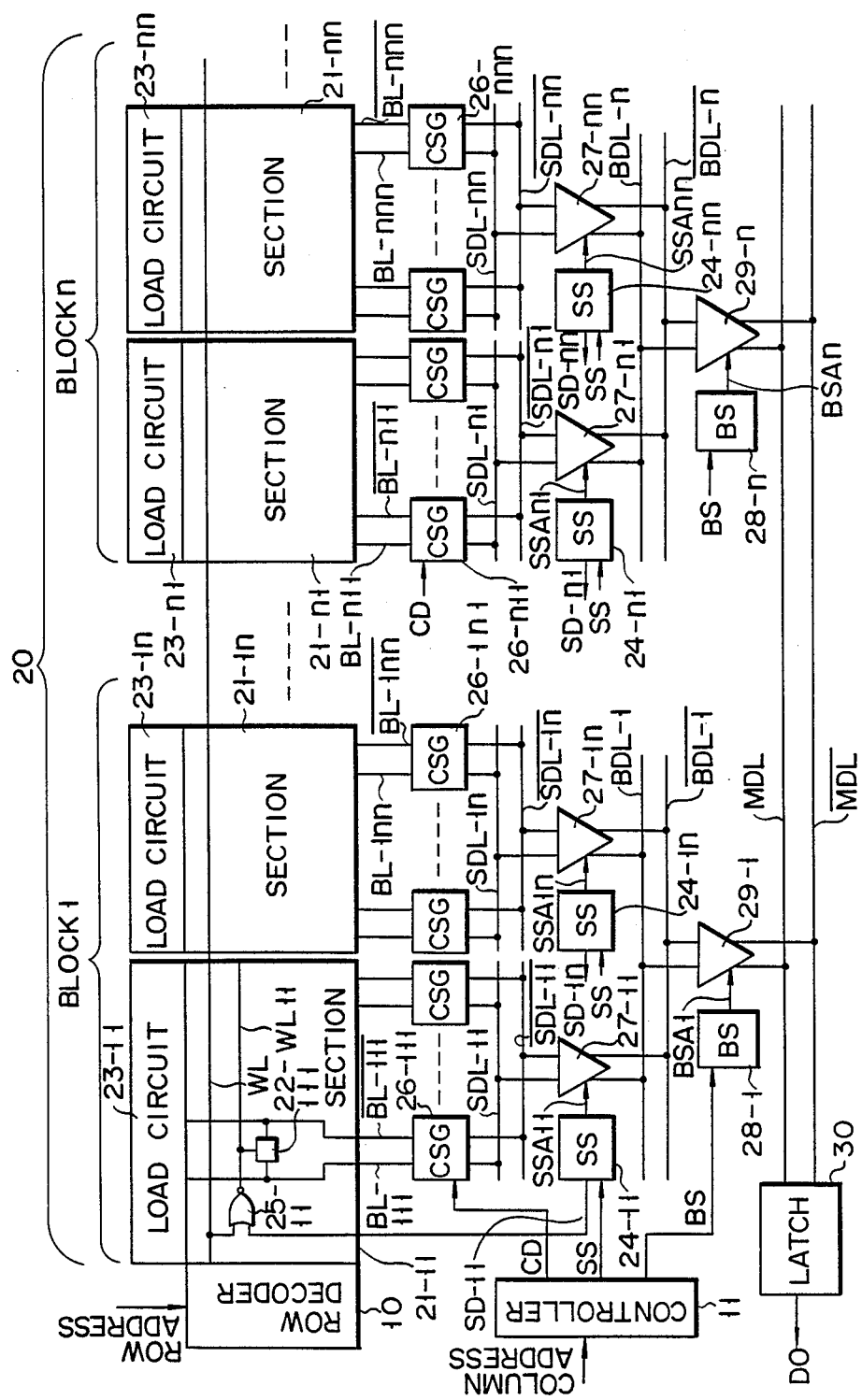
F I G. 3

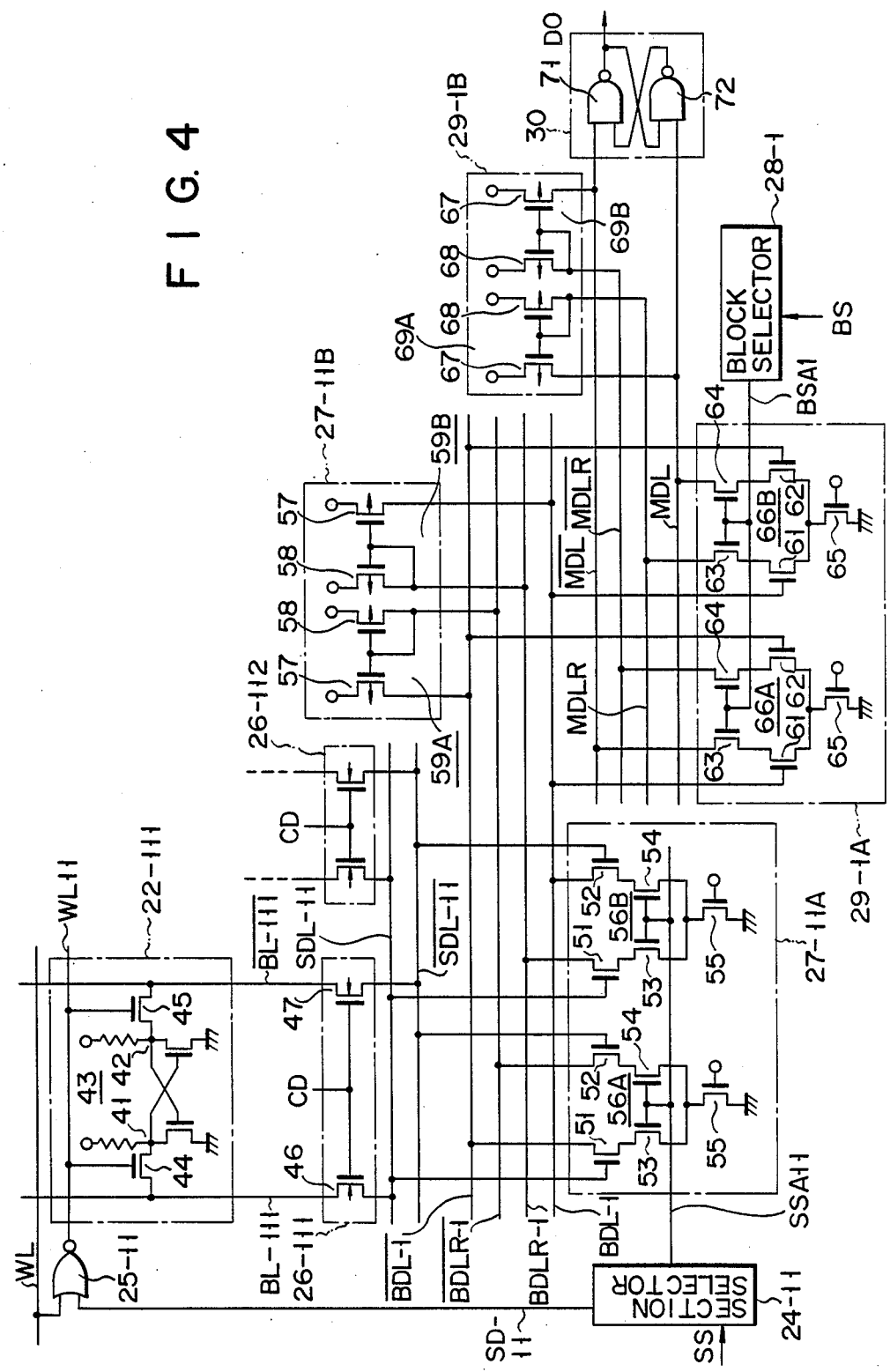
F I G. 4

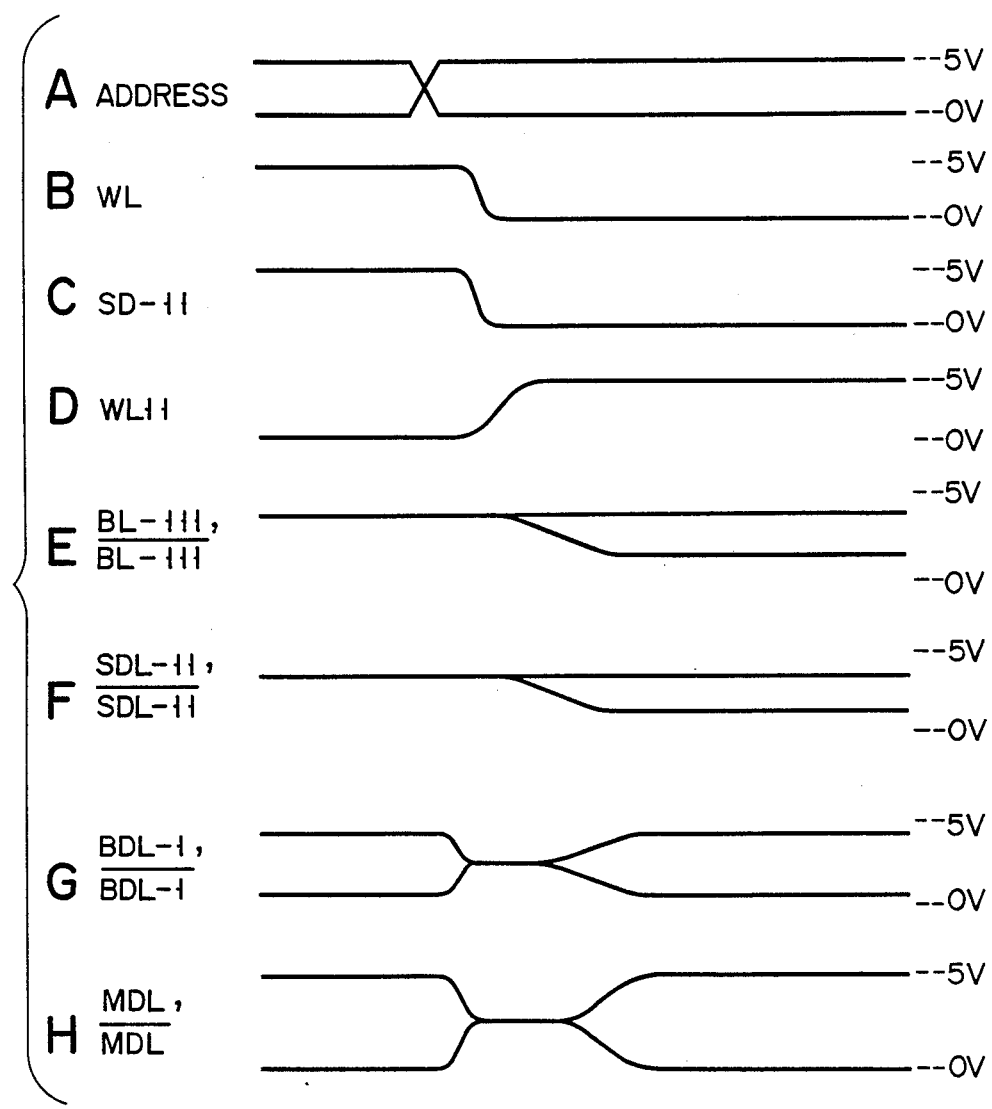
F I G. 5

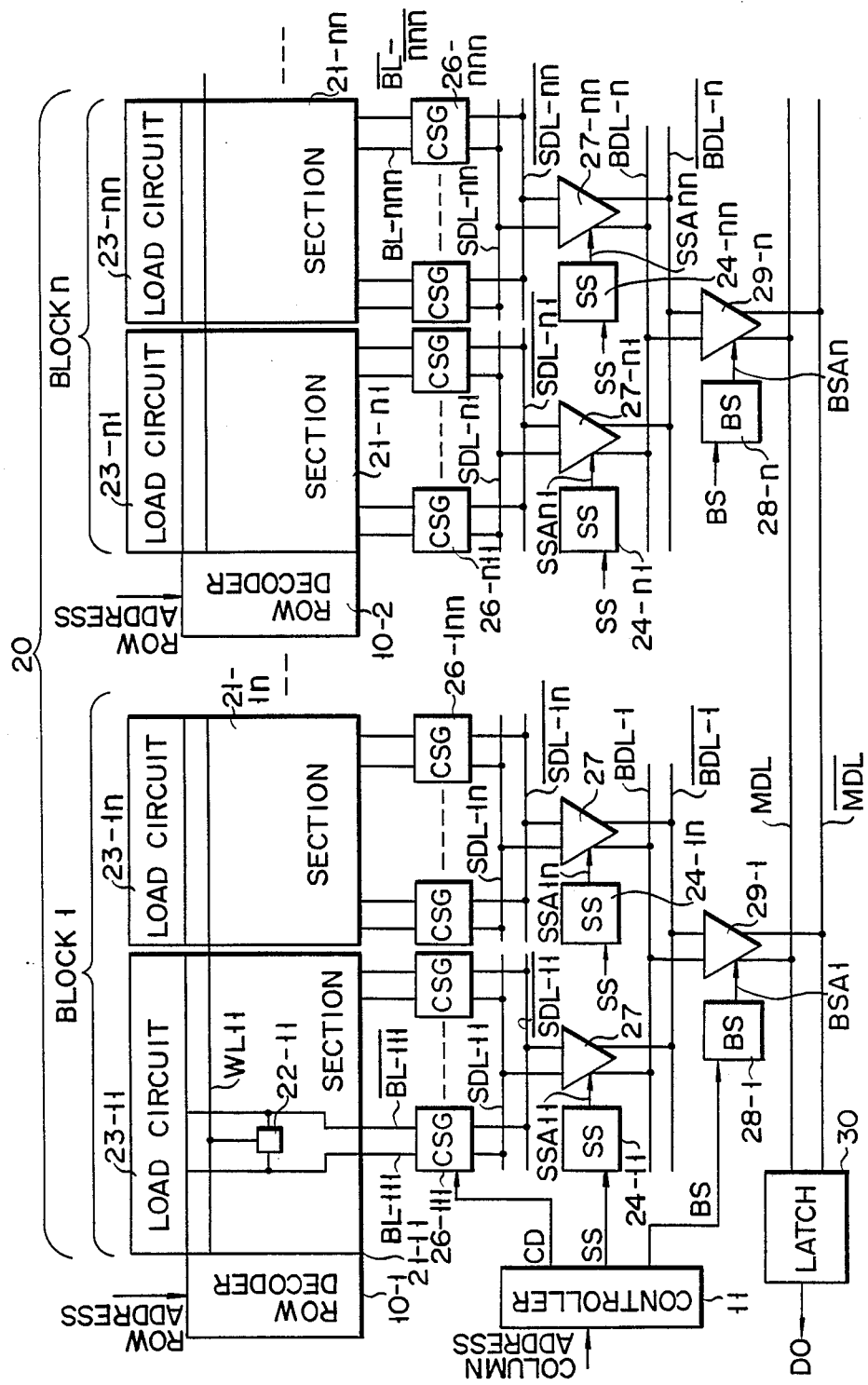
F I G. 6

STATIC SEMICONDUCTOR MEMORY WITH SECTION AND BLOCK SENSE AMPLIFIERS

BACKGROUND OF THE INVENTION

The present invention relates to a semiconductor memory constituted by, for example, insulated gate type field effect transistors, such as MOS transistors, and, in particular, to a static semiconductor memory using static type cells as its memory cells.

With regard to semiconductor memories, as the memory capacity increases due to recent improvement in process technology, a data line pair becomes longer, thus increasing the load capacity of the data line that should be driven by a memory cell. The increase in loading capacity reduces data readout speed. According to prior art memories, to reduce the load capacity to be driven by a memory cell a memory cell array is divided into a plurality of sections. This type of memory, available today, has a plurality of section data line pairs for each section. Each of the section data line pairs in each section is connected to a plurality of memory cells to be accessed.

FIG. 1 is a block diagram illustrating the structure of a semiconductor memory having its memory array divided into a plurality of sections. In FIG. 1, the memory is assumed to be of a one-bit readout type for explanatory simplicity. A memory cell array 80 is divided into a plurality of sections 81-1 to 81-n. Within each section 81-i (i=1 to n), static memory cells 82-11 to 82-1n are arranged in a two-dimensional array for each section word line WLi (i=1 to n). Referring now to section 81-1 as an example, the semiconductor memory will be explained.

Each memory cell 82-1i (i=1 to n) is coupled to word line WL1 and bit line pair BL-1i, $\overline{BL}$i (i=1 to n), each bit line pair being coupled to load circuit 83-1.

Word line WL is activated by a row decoder (not shown), and is arranged over the entire section. A signal on word line WL and section designation signal SDi (i=1 to n) are supplied to a section gate 85-i (i=1 to n). Section designation signal SD1 output from section selector 84-1 is activated only when section 81-1 is designated. Based on the output of gate 85-1, only the word line WL1 in the selected section 81-1 is activated. Data are read out from all of memory cells 82-1i (i=1 to n) coupled to this activated section word line WL1 in the selected section, and each signal pair associated with the read out data is transferred to its associated bit line pair BL-1i, $\overline{BL}$i/ (i=1 to n).

Column select gate 86-1i (i=1 to n) is controlled on the basis of column designation signal CD, and one signal pair is selected from the signal pairs on bit line pair BL-1i, $\overline{BL}$i (i=1 to n) in accordance with signal CD and is sent to section data line pair SDL-1, $\overline{SDL}$. The signal pair transferred to section data line pair SDL-1, $\overline{SDL}$ is supplied to section sense amplifier 87-1. Amplifier 87-1, provided for each section data line pair SDL-1, $\overline{SDL}$, is selectively activated by section sense amplifier activation signal SSA1 output from section selector 84-1. The output of inactive amplifier 87-1 is rendered to be a high impedance. The signal pair output from sense amplifier 87-1 is transferred on main data line pair MDL, $\overline{MDL}$ commonly running over the entire section. The signal pair on line pair MDL, $\overline{MDL}$ is supplied to main sense amplifier 88 located near an output buffer (not shown) in a chip. A signal pair amplified by sense amplifier 88 is latched by latch circuit 89 and is transferred to the output buffer as readout data D0.

FIG. 2 is a detailed circuit diagram of the structure of each section of the aforementioned conventional memory.

As illustrated, memory cell 82-11 comprises flip-flop 93 and MOS transistors 94 and 95 serving as transfer gates. Flip-flop 93 is constituted by cross-coupling the input and output terminals of two inverters 91 and 92, the input of one inverter being coupled to the output of the other and vice versa. Each inverter comprises a high resistance resistor and a driving MOS transistor. MOS transistor 94 is coupled between one output terminal of flip-flop 93 and bit line BL-11, and MOS transistor 95 coupled between the other output of flip-flop 93 and bit line $\overline{BL}$1. The gates of two MOS transistors 94 and 95 are coupled to section word line WL1 in section 81-1.

Column select gate 86-11 is coupled between bit line pair BL-11, $\overline{BL}$1 and section data line pair SDL-1, $\overline{SDL}$, and comprises two MOS transistors 96 and 97 whose gates are supplied with column select signal CD.

Section sense amplifier 87-1 is a current mirror parallel type sense amplifier and is separated into driver section 87-1A and load section 87-1B. Driver section 87-1A is further divided into drivers 106A and 106B, each having N-channel driving transistors 101, 102, N-channel switching transistors 103, 104 and an N-channel current control transistor 105. Driving transistors 101 and 102 respectively receive the signals on section data line pair SDL-1 and $\overline{SDL}$ at their gates. Switching transistors 103 and 104 receive section sense amplifier activation signal SSA1 at their gates. Similarly, load section 87-1B is separated into two current mirror type load circuits 113A and 113B, each comprising two P-channel MOS transistors 111 and 112. In sense amplifier 87-1, only driver section 87-1A is provided separately for each section data line pair. In contrast, only one load section 87-1B is provided commonly for all of the section sense amplifiers.

To use this type of section sense amplifier, reference main data line pair MDLR, $\overline{MDLR}$ is added to the intrinsic main data line pair MDL, $\overline{MDL}$.

In the aforementioned conventional memory, the memory cell array is divided into a plurality of sections and one section is selectively activated for data readout. A signal pair corresponding to the read-out data is amplified by sense amplifier 87-i (i=1 to n) and is output on main data lines MDL, $\overline{MDL}$. Then, the amplified signal pair on the line pair MDL, $\overline{MDL}$ is amplified by main sense amplifier 88 to have a CMOS drive level and then is latched by latch 89.

Since section data line pairs SDL-i, $\overline{SDL}$ (i=1 to n) are separately arranged for each section in above-mentioned memory, the load capacity can be smaller as compared with the case where the signal pair on each bit line pair BL-ii, $\overline{BL}$ii (i=1 to n) is directly transferred to main data line pair MDL, $\overline{MDL}$ through corresponding column select gate 86-ii (i=1 to n). Therefore, it is possible to directly drive a memory cell that is capable of driving just a small current. In addition, the data readout speed can be increased to some degree.

However, the greater the memory capacity becomes, the greater the number of sections. Therefore, the load capacity or the wiring capacity of main data line pair MDL, $\overline{MDL}$ is increased. In addition, the sum of the drain junction capacities of switching transistors 103 and 104 coupled to main data line pair MDL, $\overline{\text{MDL}}$ increases with an increase in the quantity of the sections. This naturally increases the load capacity that section sense amplifiers 87-i drive. Consequently, the time-dependent signal variation speed on main data line pair MDL, $\overline{\text{MDL}}$ gets slower, thus reducing the data readout speed.

As a solution to this problem, driving transistors 101, 102 in section sense amplifier 87-1 may be designed to be larger; however, the sizes of switching transistors 103 and 104 need to be increased, in which case the drain junction capacities increase further. If the sizes of the transistors in section sense amplifier 87-i are increased, therefore, the data readout speed cannot be improved. Furthermore, the increase in transistor size increases the power consumption of section sense amplifier 87.

As should be understood from the above, in the conventional static semiconductor memory, an increase in memory capacity reduces the data readout speed.

SUMMARY OF THE INVENTION

With the above situation in mind, therefore, it is an object of this invention to provide a static semiconductor memory which can increase the data readout speed even when its memory capacity is increased.

According to a static semiconductor memory of this invention, a plurality of memory cells are divided into a plurality of blocks along the running direction of word lines, with each block having a plurality of sections. Each section includes a plurality of static memory cells. At the time of data readout, a desired section is selected and data readout from the memory cells of the selected section is controlled by control means. The semiconductor memory comprises section data lines, provided for each section and supplied with data read from a memory cell, a section sense amplifier for each section, which has its input terminal coupled to the section data lines and is activated only upon section of its associated section, block data lines commonly coupled to output terminals of the individual section sense amplifiers in the same block, a block sense amplifier for each block, which has an input terminal coupled to the block data lines and is activated only upon selection of any section included in an associated block, main data lines commonly coupled to an output terminal of the block sense amplifier, and a latch circuit for latching data on the main data lines.

According to this memory, the output of the section sense amplifier provided for each section is supplied to the block sense amplifier provided for each block, and the output of the block sense amplifier is transferred to the main data lines running over all of the blocks. The data on the main data lines is latched by the latch circuit.

The distributive arrangement of the block sense amplifiers can reduce the output capacity of each section sense amplifier, and the use of fewer section sense amplifiers coupled to the main data lines can reduce the total capacity of the main data lines, thereby improving the data readout speed.

BRIEF DESCRIPTION OF THE DRAWINGS

FIG. 3 is a block diagram of the structure of a memory according to one embodiment of this invention;

FIG. 4 is a circuit diagram illustrating a practical structure of each section of the memory according to the embodiment shown in FIG. 3;

FIGS. 5(A-H) are timing charts for explaining the operation of the embodiment; and FIG. 6 is a block diagram of the structure of a memory according to another embodiment of this invention.

DETAILED DESCRIPTION OF THE PREFERRED EMBODIMENTS

Figure 1:
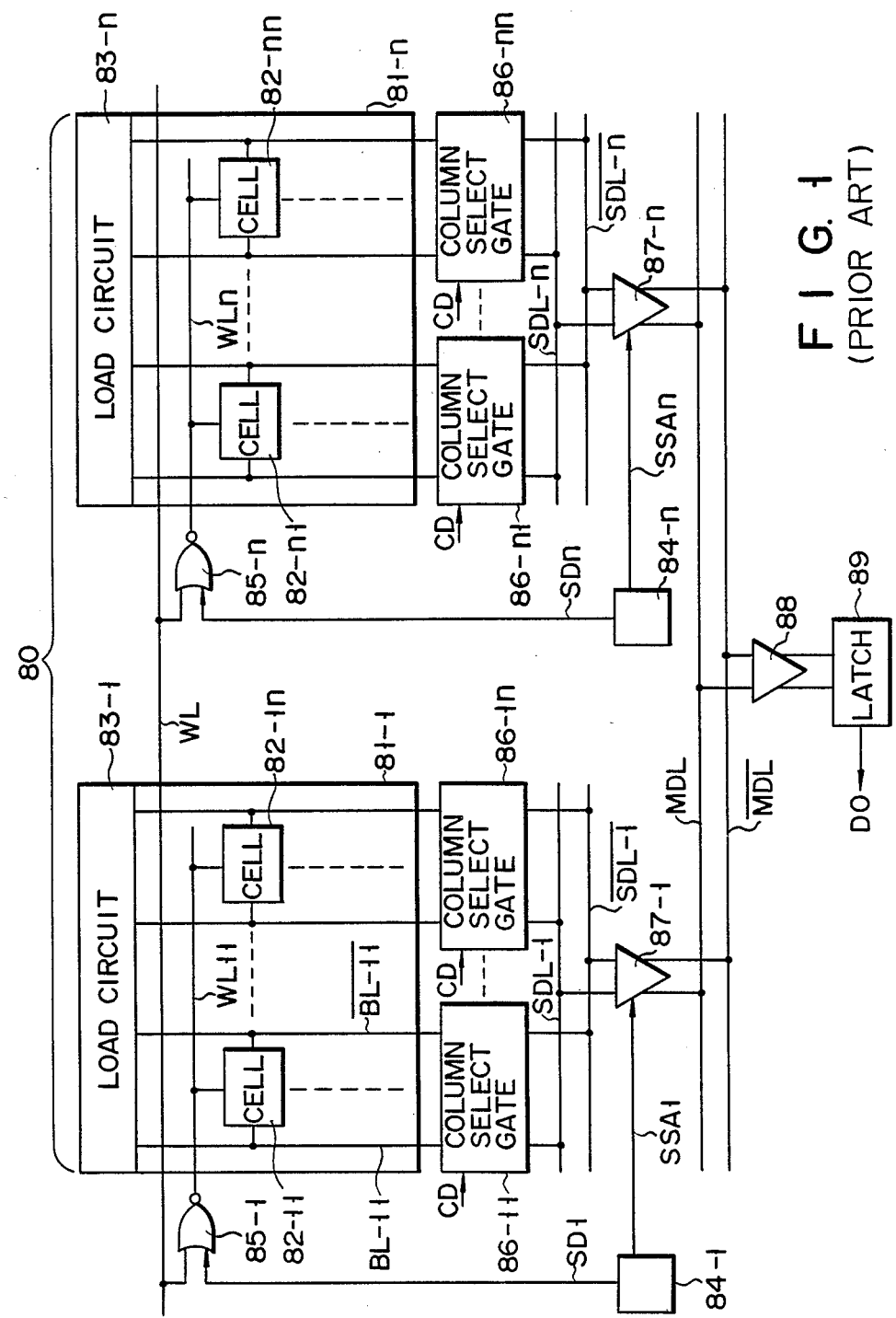
FIG. 1 is a block diagram of the structure of a conventional memory.

Static semiconductor memory according to preferred embodiments of this invention will now be explained referring to the accompanying drawings.

FIG. 3 is a block diagram illustrating the structure of one embodiment of this invention. In the following explanation, "i" is any number from 1 to n. In FIG. 3, row decoder 10 activates, for example, main word line WL selected from a plurality of word lines, in accordance with an input row address. Selected word line WL is low in an active state. In accordance with an input column address, controller 11 sends column select signal CD, section select signal SS and block select signal BS to column select gate 26-iii, section selector 24-ii and block selector 28-i, respectively.

Memory cell array 20 is divided into a plurality of blocks along the running direction of word line WL. Each block is further divided into a plurality of sections 21-ii along the running direction of word line WL. In each section 21-ii, static memory cells are arranged in a two-dimensional array. Each memory cell in each section, e.g., memory cell 22-111 in section 21-11, is coupled to section word line WL11 and bit line pair BL-111, $\overline{\text{BL}11}$, which are all provided in section 21-11. Each bit line pair in section 21-11 is coupled to load circuit 23-11. The other sections have the same arrangement.

A section gate of each section, e.g., gate 25-11, is supplied with a signal on word line WL and section designation signal SD-11, which is active-low and is output from its associated section selector 24-11. The section designation signal is activated in accordance with signal SS only when the associated section is selected. Upon activation of signal SD-11, only the output of gate 25-11 and section word line WL11 in the selected section is activated. Consequently, data are read out from every memory cell 22-11i coupled to section word line WL11, and a signal pair corresponding to the each read-out data is transferred to corresponding bit line pair BL-11i, $\overline{\text{BL}1i}$.

The activation of column select gate (CSG) 26-11i is controlled in accordance with column select signal CD from controller 11. With regard to bit line pair BL-11i, $\overline{\text{BL}11i}$ in the same section, only one pair-signal is selected by CSG 26-11i and is transferred to section data line pair SDL-11, $\overline{\text{SDL}1}$ of the associated section. Section amplifier 27-11, provided for section data line pair SDL-11, $\overline{\text{SDL}1}$, is selectively activated in accordance with section sense amplifier activation signal SSA11 output from section selector 24-11. Pair-signal on section data line pair SDL-11, $\overline{\text{SDL}1}$ is amplified by section sense amplifier 27-11 and is supplied to block data line pair BDL-i, $\overline{\text{BDL}}$ provided for each block.

For instance, a signal pair on block data line pair BDL-1, $\overline{\text{BDL}}$ is supplied to block sense amplifier 29-1, which is selectively activated in accordance with block sense amplifier activation signal BSA1 output from block selector 28-1 in accordance with signal BS. This block sense amplifier 29-1 amplifies the signal pair amplified by sense amplifier 27-11. The output signal pair from sense amplifier 29-1 is transferred to main data line pair $\overline{MDL}$, MDL provided commonly for all of the blocks. The signal pair on the main data line pair MDL, $\overline{MDL}$ is latched by latch circuit 30 located near an output buffer (not shown) in a memory chip and is sent as readout data D0 to the output buffer.

FIG. 4 is a circuit diagram illustrating the structure of each section of the embodiment as shown in FIG. 3.

Section gate 25-11 is a NOR gate and is supplied with the signal sent on main word line WL from row decoder 10 and section designation signal SD-11 from selector 24-11. Memory cell 22-111, like in the conventional memory, has flip-flop 43 and MOS transistors 44 and 45 each serving as a transfer gate. Flip-flop 43 comprises two inverters 41 and 42 having their input and output terminals cross-coupled to each other. Each inverter has a high resistance resistor and a driving MOS transistor. MOS transistor 44 is coupled between the output mode of inverter 41 and bit line BL-111, and MOS transistor 45 is coupled between the output mode of inverter 42 and bit line $\overline{BL11}$. The gates of two MOS transistors 44 and 45 are coupled to section word line WL11 in the associated section, respectively. Column select gate 26-111, which comprises two N-channel MOS transistors 46 and 47, is provided between bit line pair BL-111, $\overline{BL11}$ and section data line pair SDL-11, $\overline{SDL1}$, the gates of these transistors being supplied with column select signal CD.

Section sense amplifier 27-11 is a current mirror parallel type sense amplifier and is separated into driver section 27-11A and load section 27-11B. Driver section 27-11A has drivers 56A and 56B, each having N-channel driving transistors 51, 52, N-channel switching transistors 53, 54 and N-channel current control transistor 55. Driving transistors 51 and 52 respectively receive the signal pair on section data line pair SDL-11 and $\overline{SDL1}$ at their gates. Switching transistors 53 and 54 receive at their gates section sense amplifier activation signal SSA11 from section selector 24-11. Section 27-11A may be constituted like section 29-1A described below.

Load section 27-11B has two current mirror type load circuits 59A and 59B, each comprising two P-channel MOS transistors 57 and 58. In sense amplifier 27-11, only driver section 27-11A is provided separately for each section data line pair. In contrast, only one load section 27-11B is provided commonly for all of the section sense amplifiers.

To use this type of section sense amplifier 27-11, reference block data line pair BDLR-1, $\overline{BDLR}$ is added to the intrinsic block data line pair BDL-1, $\overline{BDL}$. In driver 56A of driver section 7-11A, the drain of transistor 51 is coupled to intrinsic block data line $\overline{BDL}$, while the drain of transistor 52 is coupled to reference block data line $\overline{BDLR}$. In driver 56B, by way of contrast, the drain of transistor 51 is coupled to reference block data line BDLR-1 while the drain of transistor 52 is coupled to intrinsic block data line BDL-1.

Block sense amplifier 29-1 is also of a current mirror parallel type sense amplifier and is separated into driver section 29-1A and load section 29-1B. Driver section 29-1A has drivers 66A and 66B, each having N-channel driving transistors 61, 62, N-channel switching transistors 63, 64 and N-channel current control transistor 65. Driving transistors 61 and 62 respectively receive the signal pair on block data line pair BDL-1 and $\overline{BDL}$ at their gates. Switching transistors 63 and 64 receive at their gates block sense amplifier activation signal BSA1 from block selector 28-1. Section 29-1A may be constituted like section 27-11A.

Load section 29-1B, like load section 27-11B, has two current mirror type load circuits 69A and 69B, each comprising two P-channel MOS transistors 67 and 68. In sense amplifier 29-1, only driver section 29-1A is separately provided in correspondence with each block data line pair. In contrast, only one load section 29-1B is provided commonly for all of the block sense amplifier driver sections.

To use this type of block sense amplifier, reference main data line pair MDLR, $\overline{MDLR}$ is added to intrinsic main data line pair MDL, $\overline{MDL}$. In driver 66A of driver section 29-1A, the drain of transistor 63 is coupled to intrinsic main data line $\overline{MDL}$, while the drain of transistor 64 is coupled to reference main data line $\overline{MDLR}$. In driver 66B, by way of contrast, the drain of transistor 63 is coupled to reference main data line MDLR while the drain of transistor 64 is coupled to intrinsic main data line MDL.

Latch circuit 30 comprises two NAND gates 71 and 72, constituting a flip-flop, and receives the signal pair on main data line pair MDL, $\overline{MDL}$.

Referring to the timing charts of FIGS. 5A to 5H, the operation of the memory will be explained below.

Assume that, as shown in FIG. 5A, an address change has occurred and a new address is input. Then, when a row address is supplied to row decoder 10, one word line WL is rendered active ("0" level) by the output of decoder 10, as shown in FIG. 5B. At this time, to designate a section belonging to one block, e.g., section 21-11 of block 1, in response to a column address received, controller 11 sends section select signal SS to section selector 24-11. In response to this signal SS, selector 24-11 renders section designation signal SD-11 active ("0" level), as shown in FIG. 5C. This signal SD-11 and a signal on word line WL are supplied to section select gate 25-11. In accordance with the output of gate 25-11, section word line WL11 is rendered active ("1" level), as shown in FIG. 5D. Only the section word line WL11 is activated in one section 21-11 within one block.

When section word line WL11 is activated, memory cells 22-11i coupled to this word line WL11 of section 21-11 are simultaneously selected and data are read out from these memory cells 22-11i in parallel. At the time of data readout, a slight voltage difference occurs between the potentials of the individual bit line pair BL11i, $\overline{BL}$-11i, as shown in FIG. 5E.

As column designation signal CD is output to CSG 26-111 from controller 11 in accordance with the input column address, for example, column select gate 26-111 is activated and the signal pair on bit line pair BL-11i, $\overline{BL11i}$ coupled to the gate 26-111 is transferred onto section data lines SDL-11, $\overline{SDL}$-1i, as shown in FIG. 5F. Further, one section sense amplifier 27-11 is activated by section sense amplifier activation signal SSA11 from section selector 24-11 so as to amplify the signal pair on section data line pair SDL-11, $\overline{SDL}$-11. The amplified pair-signal is transferred to block data line pair BDL-1, $\overline{BDL}$-1 provided for that block, as shown in FIG. 5G. In addition, block select signal BSA1 is output from block selector 28-1 in accordance with block select signal BS, which is output from controller 11 in accordance with the input column address. In response to signal BSA1, block sense amplifier 29-1 is activated.

As a result, the signal pair on block data line pair BDL-1, $\overline{BDL}$-1 is amplified in block sense amplifier 29-1, and line pair BDL-i, BDL-i, respectively. Therefore, the pair MDL, MDL, as shown in FIG. 5H. Thereafter, the data on main data line pair MDL, $\overline{MDL}$ is latched by latch circuit 30, and the latched data is sent out as read-out data D0.

As explained above, according to the memory of this embodiment, the output of section sense amplifier 27-11 serving as the first sense amplifier provided for each section, is supplied to block sense amplifier 29-1 that serves as the second sense amplifier provided for each block. The output of this block sense amplifier 29-1 is supplied to main data line pair MDL, $\overline{MDL}$ is coupled to the corresponding block. The data on main data line pair MDL, $\overline{MDL}$ is latched by latch circuit 30. Although the above explanation has been given with reference to section 21-11, the same explanation can apply to the other sections of the same block as well as the sections of the other blocks. Further, in the above explanation, the memory cells are separated into n blocks, each of which is further divided into n sections. Needless to say, however, the number of divided blocks may differ from the number of divided sections.

The output terminals of each section sense amplifier 27-ii are coupled to those of the block sense amplifier 29-ii that belongs to the same block, through block data line pair BDL-i, $\overline{BDL}$/ , respectively. Therefore, the number of transistors 51 and 52 in the section sense amplifiers 27-ii coupled to block data line pair BDL-i, $\overline{BDL}$-i, is smaller as compared with the number of transistors 101 and 102 in the section sense amplifiers 87-1 coupled to data line pair MDL, MDL in the conventional memory. This reduces the sum of the junction capacities coupled to block data line pair BDL-i, $\overline{BDL}$-i to a sufficiently small level. Furthermore, the wiring lengths of block data line pair BDL-i, $\overline{BDL}$-i are smaller than those of main data line pair MDL, MDL, thus reducing the wiring capacity. Accordingly, the output load capacity of each section sense amplifier 27-ii becomes significantly smaller than that of the section sense amplifiers 87-1 in the conventional memory, with the result that the signal pair on block data line pair BDL-i, $\overline{BDL}$-i can change at a higher speed.

The load capacity of block sense amplifier 29-i equals the wiring capacity of main data line pair MDL, $\overline{MDL}$ plus the drain junction capacity of transistors 63 and 64 of the block sense amplifier 29-1 that is coupled to the main data line pair. The load capacity of block sense amplifier 29-i for amplifying the signal pair on each block data line pair BDL-i, $\overline{BDL}$-i is greater than the load capacity of the main sense amplifier in the conventional memory. Due to the smaller number of sense amplifiers required in this invention, however, the capacity of sense amplifier 29-i is smaller than that of the section sense amplifiers in the conventional memory.

According to the static semiconductor memory of this embodiment, the output load capacity of section sense amplifier 27-ii serving as the first stage sense amplifier and that of block sense amplifier 29-i serving as the second stage sense amplifier can be distributed so as not to be in imbalance, and hence, the sum of signal delays on the individual data line pair can be made smaller. This can ensure higher speed data readout.

Figure 2:
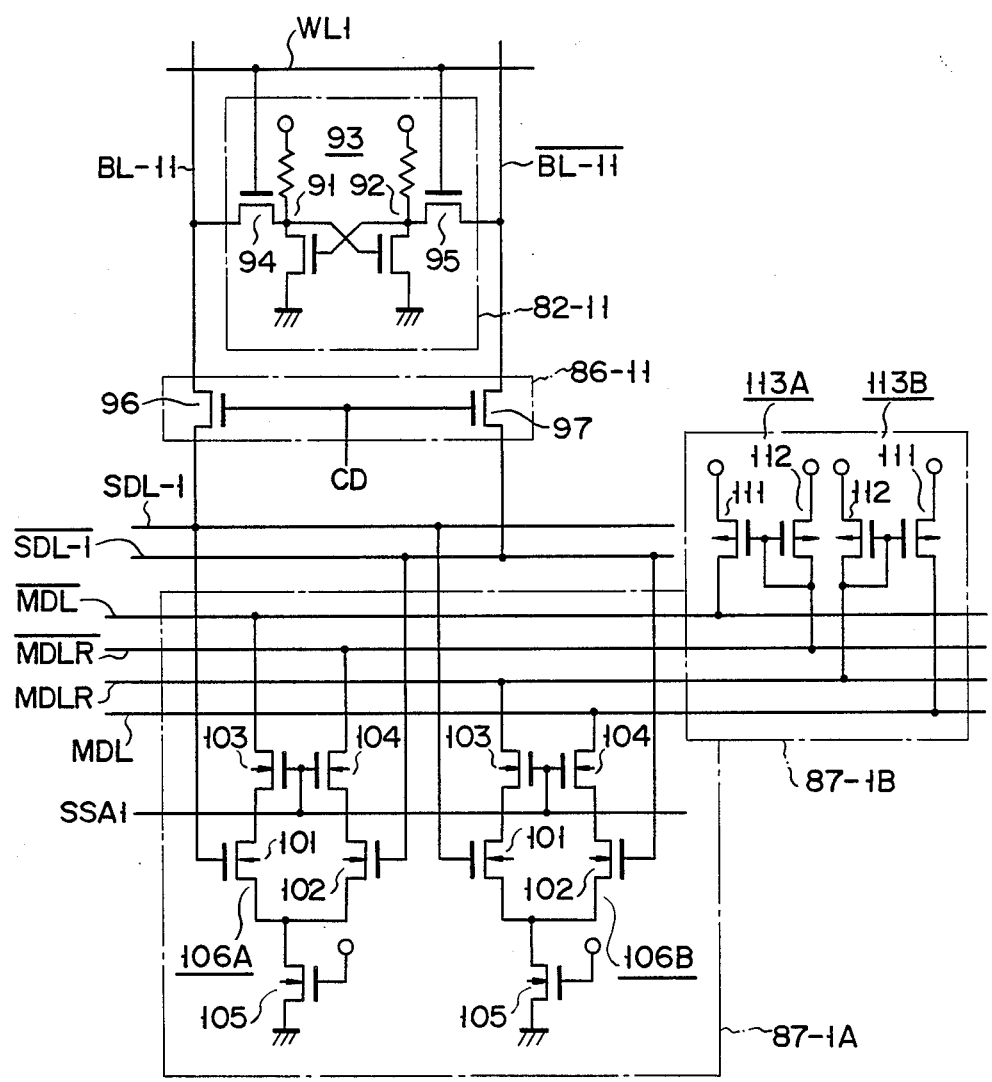
FIG. 2 is a circuit diagram illustrating a practical structure of each section of the memory shown in FIG. 1.

In addition, since the output load of section sense amplifier 27-ii according to this embodiment is smaller, there is no need to provide a large current driving function to the section sense amplifier 27-ii. Therefore, section sense amplifier 27-ii can be designed to have its driving transistors 51 and 52 on the output side, as shown in FIG. 4, thereby having a high sensitivity. In contrast, the section sense amplifier of the conventional memory as shown in FIG. 2 is designed to have switching transistors 103 and 104 provided on the output side and have a large current driving function as well.

With regard to block sense amplifier 29-i, as the amplitude of a signal pair on block data line pair BDL-i, $\overline{BDL}$-i is made relatively larger, block sense amplifier 29-i can be designed to have its switching transistors 63 and 64 on the output side, as shown in FIG. 4, thereby having a larger current driving characteristic.

As should be understood from the above, the memory of this invention has sense amplifiers arranged in two stages as per the conventional memory. If a three-stage structure is employed instead to further amplify the data on main data line pair MDL, $\overline{MDL}$ by a third stage sense amplifier, the total current flowing the sense amplifiers is increased or the transistors constituting each sense amplifier are smaller under the condition of a constant total current. In a memory IC in which the total current is limited, a three-stage structure requires that the size of the transistors be reduced. In this invention, which has two-stages of sense amplifiers to properly distribute output capacities, a higher operation speed is achievable than in a memory with the above three-stage amplifier structure. Further, the linear amplification of a current mirror parallel type sense amplifier is normally about 15. Therefore, if potential difference between section data line pair SDL-ii, $\overline{SDL}$-ii at the time of data readout is as low as 0.1 V, the potential difference between main data line pair MDL, $\overline{MDL}$ is sufficiently large as the CMOS level.

This invention is not limited to the above-described particular embodiment, but can be modified in various manners within the scope and spirit of the invention. For instance, although the memory of the above embodiment has been explained for the case where column select gate 26-iii selects one-bit data from the signal pairs on bit line pairs BL-iii, $\overline{BL}$ii/ that belong to the same section, the memory can be designed such that m-bit data selected by m column select gates 26-11i from the signal pairs on those bit line pairs BL-iii, $\overline{BL}$iii that belong to the same section are output in parallel. In this case, m section data line pairs SDL-i, $\overline{SDL}$-i need to be provided for each section, and section sense amplifier 27-ii, block data line pair BDL-i, $\overline{BDL}$-i, block sense amplifier 29-i, main data line pair MDL, MDL and latch circuit 30 need to be provided for each section data line pair SDL-i, $\overline{SDL}$-i.

Furthermore, the explanation of the above embodiment has been given with reference to memory cell 22-iii that has a high resistance load; however, this memory cell may be of a CMOS type having flip-flop 43 constituted by P-channel MOS transistors and N-channel MOS transistors. The explanation of the above embodiment is given also with reference to a so-called double word line system using a section word line and a word line. Instead of this system, however, as shown in FIG. 6, the memory cell array can be divided into a plurality of blocks with a row decoder provided for each block, thus constituting a multi-divided word line system. The basic operation in this case is the same as that of the first embodiment. In this embodiment, memory cells being accessed are directly designated by block word line WLii. In this case, block word line WLii is high when it is selected from an input row address by decoder 10-i. Thus, the section gate can be omitted. In FIG. 6, the row decoder may be provided for each section. This invention can produce the greatest effect, when applied to a memory with a double word line system that can increase the number of divided sections with only a slight increase in chip size, as compared with the multi-divided word line system.

What is claimed is:

1. A static semiconductor memory divided into a plurality of blocks, wherein each block is divided into a plurality of sections, comprising:

a plurality of word lines, each word line corresponding to a unique row address;

row decoder means, coupled to the plurality of word lines, for receiving a row address, and for selecting a word line in accordance with the row address;

a plurality of bit line pairs, each bit line pair corresponding to a unique column address, wherein the plurality of bit line pairs is divided among the plurality of sections;

a plurality of memory cells arranged in a two-dimensional array and divided among the plurality of sections, each memory cell coupled to one of the word lines and to one of the bit line pairs, wherein data is read out from a memory cell coupled to a selected word line and is provided to the bit line pair coupled to the memory cell;

a plurality of section data line pairs, each section data line pair corresponding to one of the sections;

a plurality of column select gate means, each column select gate means coupled between one of the bit line pairs in a section and the section data line pair corresponding to the section, for receiving a column select signal, and for coupling one of the bit line pairs in a section to the corresponding section data line pair in accordance with the column select signal;

a plurality of block data line pairs, each block data line pair corresponding to one of the blocks;

a plurality of section sense amplifier means, each section sense amplifier means coupled between one of the section data line pairs in a block and the block data line pair corresponding to the block, for receiving a section sense amplifier activation signal, and for amplifying data on one of the section data line pairs in a block and supplying the amplified data to the corresponding block data line pair in accordance with the section sense amplifier activation signal;

a main data line pair provided commonly for all of the blocks;

a plurality of block sense amplifier means, each block sense amplifier means coupled between one of the block data lines pairs and the main data line pair, for receiving a block sense amplifier activation signal, and for amplifying data on one of the block data line pairs and supplying the amplified data to the main data line pair in accordance with the block sense amplifier activation signal; and control means, coupled to the plurality of column select gate means, to the plurality of block sense amplifier means, and to the plurality of section sense amplifier means, for receiving a column address, and for generating, in accordance with the column address, the column select signal, the block sense amplifier activation signal, and the section sense amplifier activation signal, wherein data is read out from a memory cell that is coupled to the bit line pair selected by the column select signal, that is in the block selected by the block sense amplifier activation signal, and that is in the section selected by the section sense amplifier activation signal.

2. A static semiconductor memory in accordance with claim 1, and further comprising:

latch means, coupled to the main data line pair, for latching the data supplied to the main data line pair.

3. A static semiconductor memory in accordance with claim 1, and further comprising:

section selector means included in the control means for generating, in accordance with the column address, a section designation signal;

a plurality of section word lines in each block, wherein each section word line corresponds to one row and to one section, and wherein each memory cell is arrayed in one row and in one section and is coupled to the corresponding section word line; and a plurality of section gate means in each block, each section gate means coupled to one of the word lines and to one of the section word lines corresponding to the same row as said one word line, for receiving the section designation signal, and for coupling the selected word line to the section word line corresponding to the section selected by the section designation signal.

4. A static semiconductor memory divided into a plurality of blocks, wherein each block is divided into a plurality of sections, comprising:

a plurality of bit line pairs, each bit line pair corresponding to a unique column address, wherein the plurality of bit line pairs is divided among the plurality of sections;

a plurality of memory cells arranged in a two-dimensional array and divided among the plurality of sections, each memory cell coupled to one of the bit line pairs, wherein data is read out from a memory cell and is provided to the bit line pair coupled to the memory cell;

a plurality of section data line pairs, each section data line pair corresponding to one of the sections;

a plurality of column select gate means, each column select gate means coupled between one of the bit line pairs in a section and the section data line pair corresponding to the section, for receiving a column select signal, and for coupling one of the bit line pairs in a section to the corresponding section data line pair in accordance with the column select signal;

a plurality of block data line pairs, each block data line pair corresponding to one of the blocks;

a plurality of section sense amplifier means, each section sense amplifier means coupled between one of the section data line pairs in a block and the block data line pair corresponding to the block, for receiving a section sense amplifier activation signal, and for amplifying data on one of the section data line pairs in a block and supplying the amplified data to the corresponding block data line pair in accordance with the section sense amplifier activation signal;

a main data line pair provided commonly for all of the blocks;

a plurality of block sense amplifier means, each block sense amplifier means coupled between one of the block data lines pairs and the main data line pair, for receiving a block sense amplifier activation signal, and for amplifying data on one of the block data line pairs and supplying the amplified data to the main data line pair in accordance with the block sense amplifier activation signal; and control means, coupled to the plurality of column select gate means, to the plurality of block sense amplifier means, and to the plurality of section sense amplifier means, for receiving a column address, and for generating, in accordance with the column address, the column select signal, the block sense amplifier activation signal, and the section sense amplifier activation signal, wherein data is read out from a memory cell that is coupled to the bit line pair selected by the column select signal, that is in the block selected by the block sense amplifier activation signal, and that is in the section selected by the section sense amplifier activation signal.

5. The memory according to claim 4, wherein each of said section sense amplifier means is a current mirror parallel type sense amplifier having a driver section and a load section, said driver section being provided separately for each of said section sense amplifier means included in an associated block and said load section being provided commonly for all of said section sense amplifier means included in said associated block.

6. The memory according to claim 5, wherein said driver section includes:
- a first pair of transistors, supplied at gates with data read out from memory cells, for driving one of the corresponding block data line pair and a first reference line pair;
- a second pair of transistors, respectively coupled to said first pair of transistors and supplied commonly at gates with said section sense amplifier activation signal;
- a first transistor, commonly coupled to said second pair of transistors, for controlling current;
- a third pair of transistors, supplied at gates with data read out from memory cells, for driving the other one of said corresponding block data line pair and said first reference line pair;
- a fourth pair of transistors, respectively coupled to said third pair of transistors and supplied commonly at gates with said section sense amplifier activation signal; and
- a second transistor, commonly coupled to said fourth pair of transistors, for controlling current.

7. The memory according to claim 4, wherein said each of said block sense amplifier means is a current mirror parallel type sense amplifier having a driver section and a load section, said driver section being provided for each of said block sense amplifier means and said load section being provided commonly for all of said block sense amplifier means.

8. The memory according to claim 7, wherein said driver section includes:
- a first pair of transistors, supplied at gates with data output from said section sense amplifier means, for driving one of the main data line pair and a first reference line pair;
- a second pair of transistors, respectively coupled to said first pair of transistors and supplied commonly at gates with said block sense amplifier activation signal;
- a first transistor, commonly coupled to said second pair of transistors, for controlling current;
- a third pair of transistors, supplied at gates with data output from said section sense amplifier means, for driving the other one of said main data line pair and said first reference line pair;
- a fourth pair of transistors, respectively coupled to said third pair of transistors and supplied commonly at gates with said block sense amplifier activation signal; and
- a second transistor, commonly coupled to said fourth pair of transistors, for controlling current.

9. A static semiconductor memory divided into a plurality of blocks, wherein each block is divided into a plurality of sections, comprising:
- a plurality of bit line pairs, each bit line pair corresponding to a unique column address, wherein the plurality of bit line pairs is divided among the plurality of sections;
- a plurality of memory cells arranged in a two-dimensional array and divided among the plurality of sections, each memory cell coupled to one of the bit line pairs, wherein data is read out from a memory cell and is provided to the bit line pair coupled to the memory cell;
- a plurality of section data line pairs, each section data line pair corresponding to one of the sections and coupled to a selected one of the bit line pairs in the section;
- a plurality of block data line pairs, each block data line pair corresponding to one of the blocks;
- a plurality of section sense amplifier means, each section sense amplifier means coupled between one of the section data line pairs in a block and the block data line pair corresponding to the block, for receiving a section sense amplifier activation signal, and for amplifying data on one of the section data line pairs in a block and supplying the amplified data to the corresponding block data line pair in accordance with the section sense amplifier activation signal;
- a main data line pair provided commonly for all of the blocks;
- a plurality of block sense amplifier means, each block sense amplifier means coupled between one of the block data lines pairs and the main data line pair, for receiving a block sense amplifier activation signal, and for amplifying data on one of the block data line pairs and supplying the amplified data to the main data line pair in accordance with the block sense amplifier activation signal; and control means, coupled to the plurality of block sense amplifier means, and to the plurality of section sense amplifier means, for receiving a column address, and for generating, in accordance with the column address, the block sense amplifier activation signal and the section sense amplifier activation signal, wherein data is read out from a memory cell that is in the block selected by the block sense amplifier activation signal, and that is in the section selected by the section sense amplifier activation signal.

10. The memory according to claim 9, wherein each of said section sense amplifier means is a current mirror parallel type sense amplifier having a driver section and a load section, said driver section being provided separately for each of said section sense amplifier means included in an associated block and said load section being provided commonly for all of said section sense amplifier means included in said associated block.

11. The memory according to claim 10, wherein said driver section includes:
- a first pair of transistors, supplied at gates with data read out from memory cells, for driving one of the corresponding block data line pair and a first reference line pair;
- a second pair of transistors, respectively coupled to said first pair of transistors and supplied commonly at gates with said section sense amplifier activation signal;
- a first transistor, commonly coupled to said second pair of transistors, for controlling current;
- a third pair of transistors, supplied at gates with data read out from memory cells, for driving the other one of said corresponding block data line pair and said first reference line pair;
- a fourth pair of transistors, respectively coupled to said third pair of transistors and supplied commonly at gates with said section sense amplifier activation signal; and
- a second transistor, commonly coupled to said fourth pair of transistors, for controlling current.

12. The memory according to claim 9, wherein said each of said block sense amplifier means is a current mirror parallel type sense amplifier having a driver section and a load section, said driver section being provided for each of said block sense amplifier means and said load section being provided commonly for all of said block sense amplifier means.

13. The memory according to claim 12, wherein said driver section includes:
- a first pair of transistors, supplied at gates with data output from said section sense amplifier means, for driving one of the main data line pair and a first reference line pair;
- a second pair of transistors, respectively coupled to said first pair of transistors and supplied commonly at gates with said block sense amplifier activation signal;
- a first transistor, commonly coupled to said second pair of transistors, for controlling current;
- a third pair of transistors, supplied at gates with data output from said section sense amplifier means, for driving the other one of said main data line pair and said first reference line pair;
- a fourth pair of transistors, respectively coupled to said third pair of transistors and supplied commonly at gates with said block sense amplifier activation signal; and
- a second transistor, commonly coupled to said fourth pair of transistors, for controlling current.

14. A semiconductor memory divided into a plurality of blocks, wherein each block is divided into a plurality of sections, comprising:
- a plurality of bit line pairs, each bit line pair corresponding to a unique column address, wherein the plurality of bit line pairs is divided among the plurality of sections;
- a plurality of memory cells arranged in a two-dimensional array and divided among the plurality of sections, each memory cell coupled to one of the bit line pairs, wherein data is read out from a memory cell and is provided to the bit line pair coupled to the memory cell;
- a plurality of section data line pairs, each section data line pair corresponding to one of the sections and coupled to a selected one of the bit line pairs in the section;
- a plurality of block data line pairs, each block data line pair corresponding to one of the blocks;
- a plurality of section transfer means, each section transfer means coupled between one of the section data line pairs in a block and the block data line pair corresponding to the block, for receiving a section transfer activation signal, and for transferring data on one of the section data line pairs in a block to the corresponding block data line pair in accordance with the section transfer activation signal;
- a main data line pair provided commonly for all of the blocks;
- a plurality of block transfer means, each block transfer means coupled between one of the block data lines pairs and the main data line pair, for receiving a block transfer activation signal, and for amplifying data on one of the block data line pairs to the main data line pair in accordance with the block transfer activation signal; and
- control means, coupled to the plurality of block transfer means, and to the plurality of section transfer means, for receiving a column address, and for generating, in accordance with the column address, the block transfer activation signal and the section transfer activation signal, wherein data is read out from a memory cell that is in the block selected by the block transfer activation signal, and that is in the section selected by the section transfer activation signal.

* * * * *